United States Patent [19]

Pastor et al.

[11] Patent Number: 5,371,066
[45] Date of Patent: Dec. 6, 1994

[54] METHOD FOR OXIDIZING PRECURSOR COMPOUNDS OF SUPERCONDUCTING OXIDES

[75] Inventors: Ricardo C. Pastor, Manhattan Beach; Antonio C. Pastor, deceased, late of Manhattan Beach, both of Calif., by Ricardo C. Pastor, executor; Luisa E. Gorre, deceased, late of Camarillo, Calif., by M. Efren Gorre, administrator; Keith C. Fuller, Los Angeles, Calif.

[73] Assignee: Hughes Aircraft Company, Los Angeles, Calif.

[21] Appl. No.: 895,247

[22] Filed: Jun. 5, 1992

Related U.S. Application Data

[63] Continuation of Ser. No. 627,785, Dec. 14, 1990, abandoned.

[51] Int. Cl.$^5$ .................... C01F 11/02; C01G 3/02; H01L 39/24
[52] U.S. Cl. .................... 505/500; 423/593; 505/725; 505/742; 505/501
[58] Field of Search ............ 423/593; 505/1, 742, 505/725

[56] References Cited

U.S. PATENT DOCUMENTS

| | | | |
|---|---|---|---|
| 4,916,116 | 4/1990 | Yamazaki . | |
| 4,929,598 | 5/1990 | Bagley | 427/62 |
| 4,942,152 | 7/1990 | Itozaki | 423/593 |
| 5,079,217 | 1/1992 | Leary | 505/742 |
| 5,089,466 | 2/1992 | Sievers | 505/1 |

FOREIGN PATENT DOCUMENTS

| | | | |
|---|---|---|---|
| 3297203 | 12/1988 | Japan | 505/742 |
| 1018970 | 1/1989 | Japan . | |
| 1147878 | 6/1989 | Japan | 505/742 |
| 1262680 | 10/1989 | Japan | 505/742 |

OTHER PUBLICATIONS

*CRC Handbook of General Chem.* 63rd Ed., Weast (Editor), 1982–1983 p. B21.
Hazen "Superconductivity in High $T_c$ Bi—Ca—Sr—Cu—O . . ." Phys. Rev. Letters vol. 60(12) Mar. 21, 1988 pp. 1174–1177.
Khairullin "Low temperature microwave response it yttrium . . ." *Syn. Met.* vol. 29(23) 1988 (*Abstract*) pp. 541–546.
Osipyan "Observation of Superconductivity in Yttrium . . ." *Pisma Zh. Eksp. Teor.* vol. 49(1) (Abstract pp. 61–64).

*Primary Examiner*—Paul Lieberman
*Assistant Examiner*—John Boyd
*Attorney, Agent, or Firm*—V. D. Duraiswamy; W. K. Denson-Low

[57] ABSTRACT

A precursor material is superoxidized to a superconducting oxide material in an atmosphere containing a reactive component that reacts with and removes hydroxide ion ($OH^-$), replacing it with peroxide ion ($O^-$). Preferred reactive components include $H_2O_2$, $N_2O$, and $I_2$. The reactive component reacts with and removes hydroxide ion from the precursor material, to reach a higher oxidation state in the superconducting oxide material than possible by oxidation in molecular oxygen. The use of such a reactive component permits both faster oxidation of the precursor material at conventional temperatures and the use of lower temperatures to achieve oxidation.

9 Claims, No Drawings

METHOD FOR OXIDIZING PRECURSOR COMPOUNDS OF SUPERCONDUCTING OXIDES

This is a continuation of application Ser. No. 07/627,785 filed Dec. 14, 1990, now abandoned.

BACKGROUND OF THE INVENTION

This invention relates to the preparation of high temperature superconducting oxides, and, more particularly, to a process for oxidizing a precursor compound to the correct oxygen content for achieving superconductivity.

One of the most important scientific advancements of recent years has been the discovery of materials that exhibit superconductivity at relatively high temperatures. In the superconducting state, a material has no electrical resistivity, and excludes magnetic flux lines. These characteristics can be used to great advantage in a variety of electrical and other types of devices. Until the recent discoveries, the maximum temperature at which superconductivity was observed (the "critical temperature" or $T_c$ of the material) was about 32 K, which restricted the applications of the phenomenon to those wherein the material could be cooled to very low temperatures. The newly discovered types of high temperature nonmetallic superconductors in some cases have achieved the superconducting state above 77 K, the boiling point of liquid nitrogen, and there exists the possibility of finding room temperature superconductors.

An important class of high temperature superconductors is complex oxides. An example of a superconducting oxide is the widely investigated $YBa_2Cu_3O_{7-x}$, where x is typically about 0.2 or less. As used herein, a "high temperature oxide superconductor" is an oxide material of the form $AO_p$, having a superconducting critical temperature of the material greater than about 77 K.

The effectiveness of these oxides as superconductors is highly dependent upon their method of preparation. The superconducting oxides were first prepared by mechanically mixing the non-oxide elements, usually presented in the form of compounds such as oxides or carbonates, heating and sintering the mechanical mixture at a sufficiently high temperature to form a precursor material having a phase that is superconducting except for an oxygen deficiency, and then oxidizing the mixture in a second heat treatment. The mechanical mixing approach, also termed the solid-state reaction method, is somewhat ineffective in achieving a complete mixture and may result in the formation of extraneous phases, with the result that the final oxide may contain non-superconducting regions and have a superconducting critical temperature below that otherwise expected.

In another approach, termed the crystallization method, the non-oxide components are provided in the form of molten nitrates, and co-crystallized to form a homogeneous mixture. The crystallized material is decomposed to the oxide and sintered to form the precursor material, which is then oxidized as for the solid-state reaction method. The crystallization method produces a more intimate mix of the components during the crystallization step than does mechanical mixing, with the result that sintering and oxidation do not lead to as high a content of extraneous phases as in the solid-state reaction method.

With either method for preparing the precursor material, the final step is oxidation. During sintering, oxygen is lost to the atmosphere, and the sintered precursor material does not exhibit the desired superconductivity. The oxidation step is therefore necessary to raise the oxygen content to the correct value, so that the final material has the required oxidation states and stoichiometry. The oxidation treatment is conducted by placing the precursor material into a furnace operating at a temperature sufficiently high to attain oxidation but not so high as to cause formation of undesirable phases. In the case of $YBa_2Cu_3O_{7-x}$, for example, the sintering temperature is about 900 C. and the oxidation temperature is about 500 C. The furnace atmosphere during oxidation is an oxygen-containing gas such as oxygen, air, or an oxygen/argon mixture. Oxidation has also been accomplished at lower temperatures using an oxygen plasma.

Although oxidation at 500 C is effective, the oxidation step is slow. Many potential applications of oxide superconductors are related to electronic devices, and the devices may not be heated to high temperature or exposed to a plasma in the intermediate processing steps without damage to the previously placed electronic components. There therefore exists a need for another approach to oxidizing the precursor material, that does not require high temperatures or creation of a plasma. The present invention fulfills this need, and further provides related advantages.

SUMMARY OF THE INVENTION

The present invention provides a method for oxidizing the precursor materials for superconducting oxides in a precise, controllable fashion. The oxidation is conducted in a manner similar to the prior technique for oxidizing in oxygen or air, but is much faster if conducted the same temperatures, or alternatively may be conducted at lower temperatures. The ability to perform low temperature oxidation is a particular advantage, because there is less likelihood of damage to previously deposited portions of the circuit, in the case of an electronic device, and there is less likelihood generally of adverse reactions, such as the formation of extraneous phases, that can otherwise occur at elevated temperature. The approach also achieves a higher oxidation state of the superconducting oxide than possible by oxidation in oxygen or air, by removing hydroxide impurities found in the precursor material. The resulting oxidized superconductor material has a higher critical transition temperature and sharper transition, and is more resistant to degradation than are similar oxides made by the conventional approach.

In accordance with the invention, a method for preparing a superconducting oxide material comprises the steps of forming a precursor material containing the non-oxygen elements of the superconducting oxide material, the precursor material being deficient in oxygen relative to the superconducting oxide material; and reacting the precursor material with a reactive component that produces monatomic oxygen which reacts with hydroxide ion in an amount sufficient to oxidize the precursor material to the superconducting oxide material, the reaction occurring with an activation energy of less than that of the dissociation of diatomic oxygen. Preferred reactive components are $H_2O_2$, $N_2O$, and $I_2$, with $NO_2$ and $O_3$ operable but slightly less preferred. The reactive components are typically supplied as a flowing mixture, optionally with oxygen as a carrier gas.

The approach of the present invention permits oxidation of the precursor material at significantly lower temperatures than possible using diatomic oxygen molecules as the oxidizer. Alternatively, if the same oxidation temperature as commonly used previously is maintained, then the present approach permits the oxidation treatment to be conducted significantly faster, an economic advantage, and permits thicker pieces to be oxidized. The resulting material has a higher oxidation state than attainable with oxidation in oxygen, so that the resulting material is superior to that produced by conventional approaches. Other features and advantages of the invention will be apparent from the following more detailed description of the preferred embodiment, which illustrates, by way of example, the principles of the invention.

DETAILED DESCRIPTION OF THE INVENTION

In accordance with the invention, a method for preparing a superconducting oxide compound off the form $AO_p$ comprises the steps of forming a precursor material of the form $AO_q$, where A includes at least one metallic element, and where q is less than p; and oxidizing the precursor material in a gas including a reactive component that reacts with hydrogen peroxide to produce monatomic oxygen in an amount sufficient to oxidize the precursor material to a super conducting oxide compound of the form $AO_p$, the reaction occurring with an activation energy of less than about 120 kilocalories per mole (the dissociation energy of molecular or diatomic oxygen). Most preferably, a method for preparing a superconducting oxide material comprises the steps of forming a precursor material containing the non-oxygen elements of the superconducting oxide material but deficient in oxygen relative to the superconducting oxide material; and reacting the precursor material in a gas containing a reactive component selected from the group consisting of $NO_2$, $N_2O$, $O_3$, $I_2$, and $H_2O_2$.

In the approach of the invention, at least a portion of the hydroxide ion ($OH^-$) is removed from the precursor material and replaced by peroxide ion ($O^-$) as the superconducting oxide is formed. This approach has been termed superoxidation. The superconducting oxide reaches a higher oxidation state and greater purity with respect to anion content than possible by oxidation in oxygen or air, resulting in superior properties and greater resistance to degradation than possible with the conventionally prepared superconducting oxide.

The precursor material is the compound that contains the metallic and nonmetallic elements other than oxygen required for the final superconducting oxide. The term "non-oxygen element" is used to collectively describe all of these elements other than oxygen. (The elements other than oxygen are sometimes termed metallic elements in the scientific literature, but the more general term "non-oxygen element" is used herein to avoid any question as to whether elements such as yttrium should be termed metals.)

The precursor material is formed by any acceptable approach. The most common approaches presently used &re the previously discussed solid-state reaction and coprecipitation methods, but the present invention is not so limited. The precursor material is then oxidized using as a source of oxygen either a reactant that dissociates to produce monatomic oxygen at the temperature selected, with a relatively low activation energy for the dissociation, or a reactant that reacts with hydroxide ion to produce peroxide ion as part of the reaction sequence. Since reaction to produce the monatomic oxygen is the slow step of the conventional oxidation process, the selection of a source of oxygen having a low activation energy makes monatomic oxygen more readily available at any temperature. In particular, a supply of monatomic oxygen is available at a lower temperature than previously possible using molecular oxygen ($O_2$) gas as the source.

In the most preferred embodiment utilizing the preferred approach, the process of the invention is used to prepare thin films of the known high temperature superconducting oxide $YBa_2Cu_3O_{7-x}$, where x is about 0.2 or less. In this embodiment, A is $YBa_2Cu_3$, p is 7—x, where x is 0.2 or less, and q is something less than 7—x (i.e., closer to zero).

The preparation of specific precursor materials is well known to those skilled in the art. In the case of $YBa_2Cu_3O_{7-x}$ prepared by the solid-state reaction method, the appropriate amounts of moisture free $Y_2O_3$, $BaCO_3$, and CuO are weighed out. The amounts are such that the mole ratio of Y:Ba:Cu is 1:2:3. These powders are placed into a bottle and mixed mechanically for a period off time until complete mixing is obtained, usually about 20 minutes.

The mixture is ground with a mortar and pestle until a fine powder of uniform color obtained, usually about 20 minutes. The ground powder is spread shallowly on the bottom of an aluminum oxide crucible lined with gold foil, which is then heated in a tube furnace in air to about 900 C. for 8–12 hours. During this phase formation treatment, the constituents interdiffuse and form the superconducting phase. The powder is then cooled to about 400 C., removed from the furnace, and cooled to ambient temperature. The grinding and sintering treatment is repeated several times, usually for a total of about three times.

The powder is then formed into pellets and sintered at about 950 C. for 12 hours in air. (The powder of course may be in any appropriate physical form, and the term "pellets" is intended to be generic so as to cover any required physical form.)

At this point in the preparation procedure, the precursor material has been formed with a composition of $YBa_2Cu_3O_q$, where q is typically from about 6 to about 6.7. The superconducting phase is formed in respect to the non-oxygen elements, but is not as yet actually superconducting because of the severe oxygen deficiency.

In prior practice, at this point the sintered pellet is heated in a pure flowing oxygen atmosphere at 500 C. for a period sufficient to raise the oxygen content to p=7—x, where x is as small as possible (and may be negative), and preferably is less than 0.2. The time required depends upon the dimensions of the pellet, but typically is from 12 hours to several days. After the oxidation treatment, the pellets were cooled to ambient temperature in flowing oxygen.

In one embodiment of the present approach, the pellets of precursor material are heated in flowing $N_2O$ at a temperature of 500 C. for about 3 hours. In a second embodiment of the approach, the pellets of precursor material are heated in flowing $N_2O$ at a temperature of about 100 C. for 12 hours. The operability of lower temperature treatments depends upon the physical form of the precursor material. Low temperature treatments, where mass transport is slow through the solid, require that the precursor material be in a finely divided or film form, while higher temperature treatments can be used with more massive pieces of the precursor material.

During the oxidation treatment, the oxygen content of the precursor material increases to the required value for the superconducting oxide, so that the final oxide is of the form $YBa_2Cu_3O_{7-x}$, where x is less than 0.2. The oxidized pellet is then cooled to ambient temperature with the gas flow continuing. The $N_2O$ is at 1 atmosphere pressure, and flows at the rate of about 1 cubic foot per hour for each 20 grams of precursor material. However, these figures are to illustrate the preferred embodiments, and are not critical. $NO_2$ or $O_3$ may be substituted for the $N_2O$.

The preceding description is presented by way of illustrating preferred embodiments for preparing $YBa_2Cu_3O_{7-x}$. Other superconducting oxides are prepared in a fashion that will be apparent from the known procedures for preparing the precursor materials, the previously used oxidation procedures, and the following guidelines for choosing oxidation procedures. An example of another superconducting oxide that may be prepared by the approach of the invention is $Bi_4Ca_3Sr_3Cu_4O_{16+x}$.

Although not wishing to be bound by this explanation, during the oxidation treatment by any approach monatomic oxygen is produced from a reactive source. The atomic radius of monatomic oxygen, about 1 Angstrom, is much less than for molecular oxygen, and therefore the monatomic oxygen is able to move through the crystal lattice of the precursor material to attain generally uniform oxidation throughout. (The movement of monatomic oxygen through the interstitial regions of the lattice is sometimes termed "tunneling", but is not to be confused with electronic tunneling.) Diatomic oxygen dissociates to monatomic oxygen with an activation energy E of about 120 kilocalories per mole. This relatively high activation energy causes dissociation to be the rate limiting step for the oxidation. For example, at 100 0 K the rate of production of oxygen atoms by this dissociation is about $10^{-12}$ per second, far too slow to sustain the oxidation reaction.

The present approach has recognized this rate limiting feature, and has concluded that reduction of the activation energy for the production of monatomic oxygen can significantly increase the available content of monatomic oxygen and consequently speed up the oxidation process. Particular sources of oxygen include $NO_2$, having a dissociation activation energy of about 74 kilocalories per mole, $N_2O$, having a dissociation activation energy of about 40 kilocalories per mole, and $O_3$, having a dissociation activation energy of about 25 kilocalories per mole. Of these alternatives, $N_2O$ is preferred for commercial use because it is readily handled without highly specialized equipment, because it is widely available in pure form, because it has no adverse effects on humans and the environment, and because its activation energy permits a large decrease in the required oxidation temperature to nearly ambient temperature. The low temperature in turn permits the reactive step to be accomplished with reduced temperature-induced damage to previously formed electronic components and structures, and without the need for generating a hot plasma adjacent the material. Other solid, liquid, or gaseous sources of dissociated monatomic oxygen are also acceptable, as long as they meet the criteria set forth herein.

According to the Arrhenius rate equation, the rate of reaction k to produce monatomic oxygen is generally related to the activation energy by $$k = f \cdot e^{[-E/RT]},$$

where f is a frequency factor, E is the energy change associated with the reaction under study, R is the gas constant, and T is absolute temperature in °K. The reduced time at a constant temperature or the reduced temperature possible with the present approach may be estimated from this relationship between E and T. Although the Arrhenius equation may not be strictly accurate in describing the oxidation rate, it is sufficiently accurate to permit general conclusions because production of monatomic oxygen continues to be the rate limiting step.

The reactive component either directly or indirectly reacts with, and removes, hydroxide ions in the solid precursor material, as it is simultaneously oxidized to the superconducting oxide material. Impurity hydroxide within the lattice is thought to inhibit the charge transfer that is associated with the superconducting conduction of current. The simultaneous oxidation and removal of hydroxide from the solid is termed superoxidation, as it alters the character of the resulting superconducting oxide so that it achieves a higher oxidation state and improved stability.

The superoxidation follows a net reaction of the general form $$OH^{13} + X^\circ = O^- + HX.$$

The hydroxide ion is supplied by the precursor, material, while the superoxidizer $X^\circ$ is introduced as the reactive component in the oxidizing gas. The monatomic oxygen accomplishes the oxidation by diffusing into the solid. The reaction product HX is chosen so that it does not degrade the properties of the superconducting oxide, and is preferably removed as a gas from the solid in the flowing oxidation gas stream.

More specifically, where the superoxidizing reactant is hydrogen peroxide, $H_2O_2$, the reaction is $$OH^- + \tfrac{1}{2}H_2O_2 = O^- + H_2O$$

with the water evolved and the peroxide ion $O^-$ available for oxidation of the precursor compound. The energy change of this reaction is about $-8$ kcal (kilocalories) per mole and is therefore capable of occurring spontaneously.

Where the superoxidizing reactant produces oxygen by dissociation, as in the case of $N_2O$, $NO_2$, or $O_3$, the reaction is $$2\,OH^- \times O = 2\,O^- + H_2O$$

with the water evolved and the peroxide ion available for further oxidation reactions. The reaction energy is about zero.

Where the superoxidizing reactant is iodine, the reaction is $$OH^- + I^\circ = O^- + HI$$

with the hydrogen iodide evolved and the peroxide ion available for reaction. The energy for this reaction is about $+40$ kcal per mole.

Where they are used, the iodine or hydrogen peroxide are most readily supplied to the reaction in a flowing dilute mixture with a carrier gas, which is preferably molecular oxygen. For example, a molar ratio of 1 mole of iodine or hydrogen peroxide to 20–80 moles of oxygen gas is suitable.

Other halogens cannot be used. Fluorine and chlorine produce reaction products that remain in the solid. Bromine is marginally operable from the thermodynamics standpoint, but can react with many metallic species in superconducting oxides to alter the structure of the superconducting compound.

The following examples are intended to illustrate aspects of the invention, but should not be taken as limiting of the invention in any respect.

EXAMPLE 1

Two superconducting oxide materials, $YBa_2Cu_3O_{7-x}$ and $Bi_4Ca_3Sr_3Cu_4O_{16+x}$, were prepared by reacting the respective precursor materials at a temperature of 400 C. for 64 hours. A flowing mixture of 1 mole iodine to 20 moles molecular oxygen was the oxidizing medium, with iodine as the reactive component. On an arbitrary normalized weight scale wherein the precursor material had an initial weight of 100.00, the $YBa_2Cu_3O_{7-x}$ reached a weight of 100.95. On its own arbitrary normalized scale of 100.00, the $Bi_4Ca_3Sr_3Cu_4O_{16+x}$ reached a weight of 100.45.

EXAMPLE 2

Example 1 was repeated, except that the oxidizing medium was pure oxygen. On the same respective arbitrary normalized weight scales, the $YBa_2Cu_3O_{7-x}$ reached a weight of 100.52 and the $Bi_4Ca_3Sr_3Cu_4O_{16+x}$ reached a weight of 100.08.

The results of Example 1, the present approach, and Example 2, the prior approach, may be directly compared. The reaction in the mixture of iodine and oxygen (Example 1) reached a greater weight, indicating that more oxygen had been reacted into the superconducting oxide. A calculation demonstrates that the reaction of Example 1 produces a superconducting phase $YBa_2Cu_3O_{7.18}$ (i.e., $x=-0.18$), while the reaction of Example 2 produces a superconducting phase $YBa_2Cu_3O_{7.00}$ (i.e., $x=0.00$). This result may be further expressed as the fraction of $Cu^{+3}$ ions in the superconducting phase, a figure that is important in characterizing the superconducting behavior of the material. The greater the fraction of $Cu^{+3}$ ions, the greater the potential increase in superconducting transition temperature. The present approach as practiced in Example 1 produces a $Cu^{+3}$ fraction of 0.45, while the corresponding value for the prior approach of Example 2 is 0.33.

Removal of hydroxide was not directly measured in the treatments, but can be inferred from the chemistry discussed previously to have occurred for the oxidation in the iodine-containing mixture but not for the pure oxygen gas.

The change in the oxidizer source under the present invention thus provides a significant advance in the preparation of the superconducting oxides, by reducing the times and/or temperatures required in the oxidation step. Although a particular embodiment of the invention has been described in detail for purposes of illustration, various modifications may be made without departing from the spirit and scope of the invention. Accordingly, the invention is not to be limited except as by the appended claims.

We claim:

1. A method of preparing a superconducting oxide material, consisting of the steps of:
   forming a precursor material containing the non-oxygen elements of the superconducting oxide material, the precursor material containing hydroxide ions and being deficient in oxygen relative to the superconducting oxide material; and
   in a single step, reacting the precursor material with a gas mixture comprising oxygen and a reactive component, wherein said reactive component is $I_2$, to produce monatomic oxygen which reacts with said hydroxide ions in an amount sufficient to oxidize the precursor material to the superconducting oxide material such that said precursor material remains free of said reactive component or any reaction product thereof, the reaction occurring with an activation energy of less than that of the dissociation of diatomic oxygen, said reacting taking place by heating said precursor material at an elevated temperature of about 500° C. or less.

2. The method of claim 1, wherein the step of forming includes the step of
   preparing a solid mixture of compounds containing the non-oxygen elements.

3. The method of claim 1 wherein said gas mixture comprises about 20 to 30 moles of oxygen per 1 mole of $I_2$.

4. A method for preparing a superconducting oxide compound of the form $AO_p$, consisting of the steps of:
   forming a precursor material of the form $AO_q$, where A includes at least one metallic element, and where q is less than p, said precursor material containing hydroxide ions; and
   in a single step, oxidizing the precursor material in a gas mixture comprising oxygen and a reactive component, wherein said reactive component is $I_2$, to produce monatomic oxygen which reacts with said hydroxide ions in an amount sufficient to oxidize the precursor material to a superconducting oxide compound of the form $AO_p$ such that said precursor material remains free of said reactive component or any reaction product thereof, the reaction occurring with an activation energy of less than about 120 kilocalories per mole, said reacting taking place by heating said precursor material at an elevated temperature of about 500° C. or less.

5. The process of claim 4, wherein A is $YBa_2Cu_3$.

6. The process of claim 4, wherein A is $Bi_4Ca_3Sr_3Cu_4$.

7. The method of claim 4 wherein said gas mixture comprises about 20 to 30 moles of oxygen per 1 mole of $I_2$.

8. A method for preparing a superconducting oxide material, consisting of the steps of:
   forming a precursor material containing the non-oxygen elements of the superconducting oxide material but deficient in oxygen relative to the superconducting oxide material and containing hydroxide ions; and
   in a single step, reacting the precursor material with a flowing gas stream containing oxygen and a reactive component selected from the group consisting of $I_2$ $H_2O_2$ such that said precursor material remains free of said reactive component or any reaction product thereof, the reaction taking place by heating said precursor material at an elevated temperature of about 500° C. or less.

9. The method of claim 8 wherein said gas mixture comprises about 20 to 30 moles of oxygen per 1 mole of $I_2$.

* * * * *